United States Patent
Chen et al.

(10) Patent No.: US 12,144,151 B2
(45) Date of Patent: Nov. 12, 2024

(54) SYSTEMS AND METHODS FOR VAPOR-COMPRESSED COOLING

(71) Applicant: Quanta Computer Inc., Taoyuan (TW)

(72) Inventors: Chao-Jung Chen, Taoyuan (TW); Yu-Nien Huang, Taoyuan (TW); Herman Tan, Taoyuan (TW); Tien-Juei Chuang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 267 days.

(21) Appl. No.: 17/725,053

(22) Filed: Apr. 20, 2022

(65) Prior Publication Data
US 2023/0262934 A1 Aug. 17, 2023

Related U.S. Application Data

(60) Provisional application No. 63/268,046, filed on Feb. 15, 2022.

(51) Int. Cl.
*H05K 7/20* (2006.01)

(52) U.S. Cl.
CPC ..... *H05K 7/20354* (2013.01); *H05K 7/20309* (2013.01); *H05K 7/20318* (2013.01); *H05K 7/20381* (2013.01)

(58) Field of Classification Search
CPC ........... H05K 7/20381; H05K 7/20354; H05K 7/20809; H05K 7/20309; H05K 7/20318
See application file for complete search history.

(56) References Cited

U.S. PATENT DOCUMENTS

2009/0178425 A1* 7/2009 Tsuchiya ............ H05K 7/20354
165/104.33

FOREIGN PATENT DOCUMENTS

| JP | 2001203308 A | * | 7/2001 |
| JP | 2008085144 A | | 4/2008 |

(Continued)

OTHER PUBLICATIONS

JP Office Action for Application No. 2022-171328, mailed Sep. 12, 2023, w/ First Office Action Summary and English translation, 7 pp.

(Continued)

*Primary Examiner* — Frantz F Jules
*Assistant Examiner* — Martha Tadesse
(74) *Attorney, Agent, or Firm* — NIXON PEABODY LLP (57) ABSTRACT

A fluid cooling system includes a boiling plate, a compressor, and a condenser. The boiling plate contacts a heat-generating electronic component. The boiling plate receives a liquid such that the liquid absorbs heat from the electronic component and evaporates into a vapor. The compressor is fluidly connected the boiling plate and receives the vapor of the boiling plate. The compressor increases the pressure of the vapor such that the temperature of the vapor increases, and such that a saturation temperature of the vapor increases. The condenser is fluidly connected to the compressor and the boiling plate. The condenser receives the vapor from the compressor and removes heat from the vapor such that the vapor condenses back into the liquid. The boiling plate receives the liquid from the condenser. The system can include a pump that circulates the liquid and the vapor between the boiling plate, the compressor, and the condenser.

17 Claims, 3 Drawing Sheets

(56) References Cited

FOREIGN PATENT DOCUMENTS

| | | | |
|---|---|---|---|
| JP | 2013089620 | A | 5/2013 |
| JP | 2019110199 | A | 7/2019 |
| TW | 200607064 | A | 2/2006 |
| TW | 200926258 | A | 6/2009 |

OTHER PUBLICATIONS

TW Office Action for Application No. 111127943, mailed Nov. 10, 2023, w/ First Office Action Summary 6 pp.
TW Search Report for Application No. 111127943, mailed Nov. 10, 2023, 1 pp.

\* cited by examiner

SYSTEMS AND METHODS FOR VAPOR-COMPRESSED COOLING

CROSS-REFERENCE TO RELATED APPLICATIONS

This application claims priority from and the benefit of U.S. Provisional Patent Application Ser. No. 63/268,046, filed on Feb. 15, 2022, titled "High Performance Vapor Compressed Cycle Liquid Cooling System," which is hereby incorporated by reference herein in its entirety.

FIELD OF THE INVENTION

The present invention relates generally to systems and methods for cooling electronic devices or components, and more specifically, to systems and methods for using vapor-compressed liquid cooling to cool electronic devices or components.

BACKGROUND OF THE INVENTION

Computing devices (such as servers) typically contain one or more heat-generating electronic components, such as a central processing unit (CPU), a graphics processing unit (GPU), and others. To aid in cooling these heat-generating electronic components, fluid cooling systems can be used. Fluid cooling systems use a fluid to remove heat from the heat-generating electronic components. The fluid is a liquid when it absorbs the heat, and the heated liquid evaporates into a vapor. The vapor is then condensed by a condenser, which removes heat from the vapor so that the vapor condenses back into the liquid. However, the heat removal capacity of the condenser is limited by the saturation temperature of the fluid. Thus, improved systems and methods for cooling heat-generating electronic components are needed.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a fluid cooling system comprises a boiling plate, a compressor, and a condenser. The boiling plate is configured to contact a heat-generating electronic component. The boiling plate is further configured to receive a liquid such that the liquid absorbs heat from the heat-generating electronic component and evaporates into a vapor. The compressor is fluidly connected to the boiling plate. The compressor is configured to receive the vapor from the boiling plate and increase a pressure of the received vapor, such that (i) the temperature of the vapor increases and (ii) a saturation temperature of the vapor increases from a first saturation temperature to a second saturation temperature. The condenser is fluidly connected to the compressor and the boiling plate. The condenser is configured to receive the vapor from the compressor and remove heat from the vapor, such that the vapor condenses back into the liquid.

In some implementations, the liquid received by the boiling plate is saturated liquid, and absorption of the heat from the heat-generating electronic component causes the saturated liquid to become saturated vapor.

In some implementations, removing heat from the saturated vapor by the condenser causes the saturated vapor to become saturated liquid.

In some implementations, the system further comprises a radiator that is fluidly coupled between the condenser and the boiling plate. The radiator is configured to receive the liquid from the condenser.

In some implementations, the radiator is configured to decrease the temperature of the liquid and the pressure of the liquid, such that the saturation temperature of the liquid decreases from the second saturation temperature to the first saturation temperature.

In some implementations, the boiling plate is configured to receive the liquid from the radiator.

In some implementations, the system further comprises one or more fans. The one or more fans are configured to cause air to flow past the condenser, the radiator, or both the condenser and the radiator.

In some implementations, the air flowing past the condenser aids in removing heat from the vapor to cause the vapor to condense back into the liquid.

In some implementations, the air flowing past the radiator aids in removing heat from the liquid to decrease the temperature of the liquid.

In some implementations, the increase in pressure of the vapor by the compressor causes the liquid and the vapor to circulate between the boiling plate, the compressor, and the condenser.

In some implementations, the boiling plate is formed at least partially from a thermally conductive material that is configured to conduct heat from the heat-generating electronic component to the liquid.

In some implementations, the boiling plate has a liquid input configured to receive the liquid from the condenser, and a vapor output configured to output the vapor to the compressor.

In some implementations, the liquid absorbs heat from the heat-generating electronic component and evaporates into the vapor as the liquid travels from the liquid input of the boiling plate to the vapor output of the boiling plate.

In some implementations, the system further comprises a heating component fluidly coupled between the boiling plate and the compressor. The heating component is configured to increase the temperature of the vapor and not the saturation temperature of the vapor.

According to certain aspects of the present disclosure, a method of cooling a heat-generating electronic component comprises causing a liquid to flow past the heat-generating electronic component, such that the liquid absorbs heat from the heat-generating electronic component and evaporates into a vapor. The method further comprises causing the vapor to flow from the heat-generating electronic component to a compressor. The method further comprises increasing a pressure of the vapor using the compressor, such that (i) the temperature of the vapor increases and (ii) a saturation temperature of the vapor increases from a first saturation temperature to a second saturation temperature. The method further comprises causing the vapor to flow from the compressor to a condenser. The method further comprises removing heat from the vapor using the condenser, such that the vapor condenses back into the liquid.

In some implementations, the method further comprises causing the liquid to flow from the condenser to a radiator; and decreasing the temperature of the liquid and the pressure of the liquid using the radiator, such that the saturation temperature of the liquid decreases from the second saturation temperature to the first saturation temperature.

In some implementations, the method further comprises causing air to flow past the condenser, the radiator, or both the condenser and the radiator, using one or more fans.

In some implementations, the air flowing past the condenser removes heat from the vapor and causes the vapor to condense back into the liquid, and the air flowing past the radiator removes heat from the liquid to decrease the temperature of the liquid.

In some implementations, the liquid that flows past the heat-generating electronic component is saturated liquid, and absorption of the heat from the heat-generating electronic component causes the saturated liquid to become saturated vapor.

In some implementations, removing heat from the saturated vapor by the condenser causes the saturated vapor to become saturated liquid.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Computing devices (such as servers) typically contain one or more heat-generating electronic components, such as a central processing unit (CPU), a graphics processing unit (GPU), and others. To aid in cooling these heat-generating electronic components, a fluid cooling system can be used. The system uses a fluid that absorbs heat from the heat-generating electronic components when the fluid is a liquid, so that the liquid evaporates into a vapor. The vapor can be compressed by a compressor, which raises the saturation temperature and the temperature of the vapor. The vapor can then be condensed by a condenser to remove heat from the vapor and causes the heat to condense back into the liquid. The liquid can then flow back to the heat-generating electronic components to absorb more heat, and continue the heat removal cycle.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1:
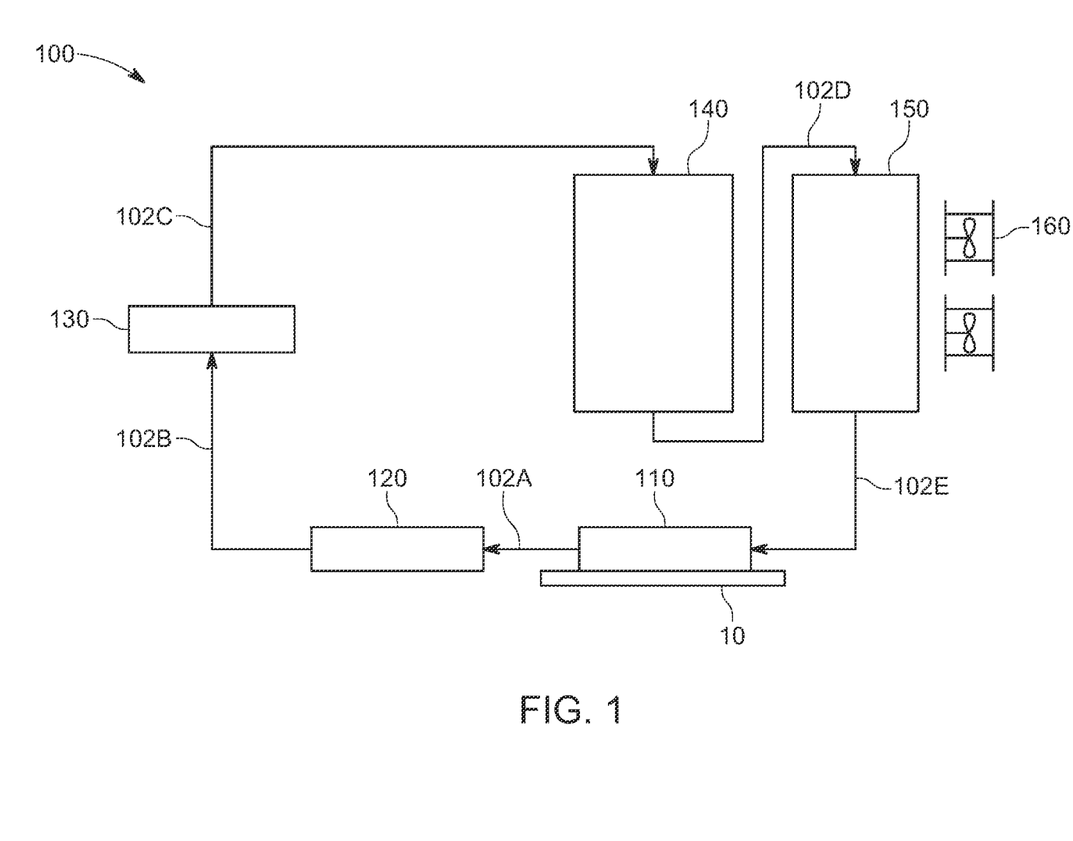
FIG. 1 is a block diagram of a system for cooling a heat-generating electronic component, according to certain aspects of the present disclosure.

FIG. 1 illustrates a fluid cooling system 100 that can be used to cool a heat-generating electronic component 10 within a computing device, such as a server. Generally, the computing device will include one or more heat-generating electronic components, such as a central processing unit (CPU), a graphics processing unit (GPU), a dual in-line memory module (DIMM), a network card, a hard disk drive (HDD), a solid state drive (SSD), or a field programmable gate array (FPGA). The system 100 can be thermally coupled to the heat-generating electronic component 10 during operation of the computing device, to aid in cooling the heat-generating electronic component 10.

The system 100 includes a variety of different components that are fluidly coupled together to allow a fluid to continually circulate through the components. As the fluid circulates, the fluid removes heat from the heat-generating electronic component 10. Generally, the fluid will initially be a liquid (e.g., the fluid in a liquid phase) that can be heated to evaporate into a vapor (e.g., the fluid in a vapor phase). The vapor can then be cooled to condense back into the liquid, and the cycle can repeat. The various components of the system 100 can be fluidly coupled to each other via fluid pathway segments. In some implementations, the segments are formed from tubes and/or pipes through which the fluid can travel, in both liquid and vapor phases. In other implementations, the segments are formed from other structures.

In the illustrated implementation, the system 100 includes a boiling plate 110, a heating component 120, a compressor 130, a condenser 140, a radiator 150, and a set of fans 160. The boiling plate 110 can be formed partially or wholly from a thermally conductive material, and is generally in direct physical contact with the heat-generating electronic component 10. FIG. 1 shows the boiling plate 110 being placed on top of the heat-generating electronic component 10. However, the boiling plate 110 can generally be in any positional relationship with the heat-generating electronic component 10. Heat that is generated by the heat-generating electronic component 10 will be absorbed by the boiling plate 110.

During operation of the system 100, the fluid in its liquid phase absorbs heat from the boiling plate 110 as the liquid travels through and/or past the boiling plate 110, and evaporates into a vapor. The liquid may additionally or alternatively absorb heat directly from the heat-generating electronic component 10. In some implementations, the boiling plate 110 has a liquid input, a fluid output, and an internal channel. The liquid enters the liquid input, absorbs heat from the heat-generating electronic component 10 the liquid it travels through the channel, and evaporates (e.g., boils) into the vapor due to the increased heat. The vapor then exits the vapor output of the boiling plate 110. In other implementations, the liquid may additionally or alternatively travel past the boiling plate 110 while contacting the exterior surface of the boiling plate 110.

Generally, when the liquid enters the boiling plate 110 (e.g., before the liquid absorbs any heat from the heat-generating electronic component 10), the temperature of the liquid will be at or just below the saturation temperature of the fluid. The saturation temperature (also referred to as the boiling point) is the temperature at which the liquid evaporates into vapor (e.g., the temperature at which the fluid undergoes a phase transition from the liquid phase to the vapor phase, and vice-versa). The liquid is thus considered to be a saturated liquid.

Generally, the saturated liquid absorbs a sufficient amount of heat from the heat-generating electronic component 10 to cause the liquid to evaporate, and no more. As such, the vapor leaving the boiling plate 110 will have a temperature that is at or just above the saturation temperature of the fluid, and is considered to be a saturated vapor. The heat-generating electronic component 10 and/or the boiling plate 110 thus either (i) do not increase the temperature of the fluid as the fluid changes phases from liquid to vapor, or (ii) increase the temperature of the fluid very little.

Fluid pathway segment 102A fluidly couples the boiling plate 110 and the heating component 120. After the saturated liquid absorbs heat from the heat-generating electronic component 10 and evaporates into the saturated vapor, the vapor flows through the fluid pathway segment 102A from the boiling plate 110, where it is received by the heating component 120. The heating component 120 (sometimes referred to as a reheater) can be any suitable component that is used to heat the saturated vapor. In some implementations, the heating component 120 includes a heating coil (e.g., a coil of wire that can be electrically energized to heat the coil) that is coupled to the exterior of the pipe through which the saturated liquid flows. The pipe and the heating coil can be covered in an adiabatic material (e.g., a thermally insulating material) to prevent heat from the heating coil from escaping, and to ensure that the heat from the heating coil increases the temperature of the liquid.

The heating component 120 heats up the saturated vapor as the saturated vapor passes through and/or by the heating component 120. The heating component 120 does not change the saturation temperature of the vapor, however. Thus, the vapor that exits the heating component 120 is at a temperature higher than the saturation temperature and is no longer saturated, and can be referred to as superheated vapor.

Fluid pathway segment 102B fluidly couples the heating component 120 and the compressor 130. The vapor (superheated and non-saturated) flows through the fluid pathway segment 102B from the heating component 120, where it is received by the compressor 130. The compressor 130 is configured to increase the pressure of the vapor. The compressor 130 can be any suitable device that can be used to increase the pressure of (e.g., compress) the superheated vapor. For example, in some implementations, the compressor 130 is a positive displacement compressor, such as a reciprocating compressor, an ionic liquid piston compressor, a rotary screw compressor, a rotary vane compressor, a rolling piston compressor, a scroll compressor, or a diaphragm compressor. In other implementations, the compressor 130 is a dynamic compressor, such as an air bubble compressor, a centrifugal compressor, a diagonal or mixed-flow compressor, or an axial compressor. The compressor 130 can be a hermetically sealed compressor, an open compressor, or a semi-hermetic compressor. The compressor 130 can also be a single-stage compressor or a multi-stage compressor.

When the compressor 130 compresses the vapor, the pressure of the vapor increases. This pressure increase causes the actual temperature of the vapor to increase, and also causes the saturation temperature of the vapor to increase. Generally, the saturation temperature will increase from a lower first saturation temperature, to a higher second saturation temperature. The actual temperature of the vapor is generally increased to the second saturation temperature, such that the vapor again becomes saturated vapor, but now at a higher temperature as compared to the saturated vapor produced by the boiling plate. Thus, whereas the heating component 120 increases the current temperature of the vapor and not the saturation temperature of the vapor, the compressor 130 increases both the current temperature and the saturation temperature of the vapor, by increasing the pressure of the vapor.

Fluid pathway segment 102C fluidly couples the compressor 130 and the condenser 140. The saturated vapor that exits the compressor 130 flows through the fluid pathway segment 102C, where it is received by the condenser 140. The condenser 140 is configured to remove heat from the saturated vapor, such that the temperature of the saturated vapor decreases and the saturated vapor condenses back into a saturated liquid. Because the compressor 130 raised the saturation temperature of the saturation vapor, the saturated liquid that flows out of the condenser 140 will have a higher temperature than the saturated liquid that flows out of the boiling plate 110. Generally, the condenser 140 only removes an amount of heat sufficient to cause the saturated vapor to condense into the saturated liquid. As such, the condenser 140 either does not decrease the temperature of the fluid as it changes phases from vapor to liquid, or decreases the temperature of the fluid very little. The condenser 140 also does not change the saturation temperature of the liquid.

The condenser 140 can have any structure suitable to remove heat from the saturated vapor. In the illustrated implementation, the system includes the set of fans 160. The fans 160 cause air to flow past the condenser 140, which aids in removing heat from the saturated vapor so that it condenses back into a saturated liquid. The condenser 140 can have a series of one or more tubes, pipes, manifolds, etc., through which the saturated vapor flows. As the air from the fans 160 flows past the tubes, heat is removed from the saturated vapor. Additionally or alternatively, the condenser 140 may include a body that is formed from a thermally conductive material. Heat can be transferred from the saturated vapor to the body of the condenser 140, and the air from the fans 160 can remove heat from the body of the condenser 140. In some implementations, the condenser 140 is a surface condenser, such as a shell and tube heat exchanger. A shell and tube heat exchanger has an outer shell through which the saturated vapor flows, and a series of internal tubes or pipes (which can be straight or U-shaped) through which a separate fluid flows, in order to remove heat from the saturated vapor.

Fluid pathway segment 102D fluidly couples the condenser 140 to the radiator 150. The saturated liquid from the condenser 140 flows through the fluid pathway segment 102D, where it is received by the radiator 150. The radiator 150 is configured to decrease the temperature of the saturated liquid, and also decrease the pressure of the saturated liquid. Decreasing the pressure of the saturated liquid causes the saturation temperature of the saturated liquid to decrease back to the first saturation temperature. The liquid that flows out of the radiator 150 will have a temperature generally equal to this first saturation temperature. Thus, the radiator 150 generally returns the liquid back to the state existed in prior to entering the boiling plate.

The radiator 150 can have a similar structure as the condenser 140. For example, the radiator 150 can include a series of tubes, pipes, manifolds, etc., through which the saturated liquid flows. Air from the fans 160 can flow over the tubes to aid in removing heat from the saturated liquid, and thus decrease the temperature of the saturated liquid. In some implementations, the radiator 150 has a body formed from a thermally conductive material that absorbs heat from the saturated liquid as the saturated liquid flows within the tubes. The air from the fans 160 can aid in removing heat from the body of the radiator 150.

The tubes of the radiator 150 can have a varying cross-section, which causes the pressure of the liquid to decrease as it flows through the radiator 150. For example, in some implementations, the radiator 150 includes a first manifold facing a second manifold. Liquid from the condenser 140 flows into the input of the first manifold, which then divides into several smaller branches. The branches of the first manifold are coupled to corresponding branches of a second manifold, which then combine into an output of the second manifold. The cross-section of the manifolds increases from the input of the first manifold to the output of the second manifold. Thus, as the liquid flows through the radiator 150, the pressure of the liquid decreases. Other structural implementations of the radiator 150 may also be used.

Fluid pathway segment 102E fluidly couples the radiator 150 to the boiling plate 110. The liquid that flows out of the radiator 150 (which is now back to the first saturation temperature) flows through the fluid pathway segment 102E, where it is received by the boiling plate 110. At the boiling plate 110, the liquid can absorb heat from the heat-generating electronic component 10, such that the cycle begins again.

The system 100 allows the condenser 140 to operate more efficiently. Generally, the heat removal capacity of the condenser 140 is limited when used to condense a saturated vapor with a lower saturation temperature. The condenser 140 operates more efficiently when used to condense a saturated vapor with a higher temperature. By compressing the saturated vapor with the compressor 130, the saturated vapor remains saturated at a higher temperature, allowing the condenser 140 to operate more efficiently.

Figure 2:
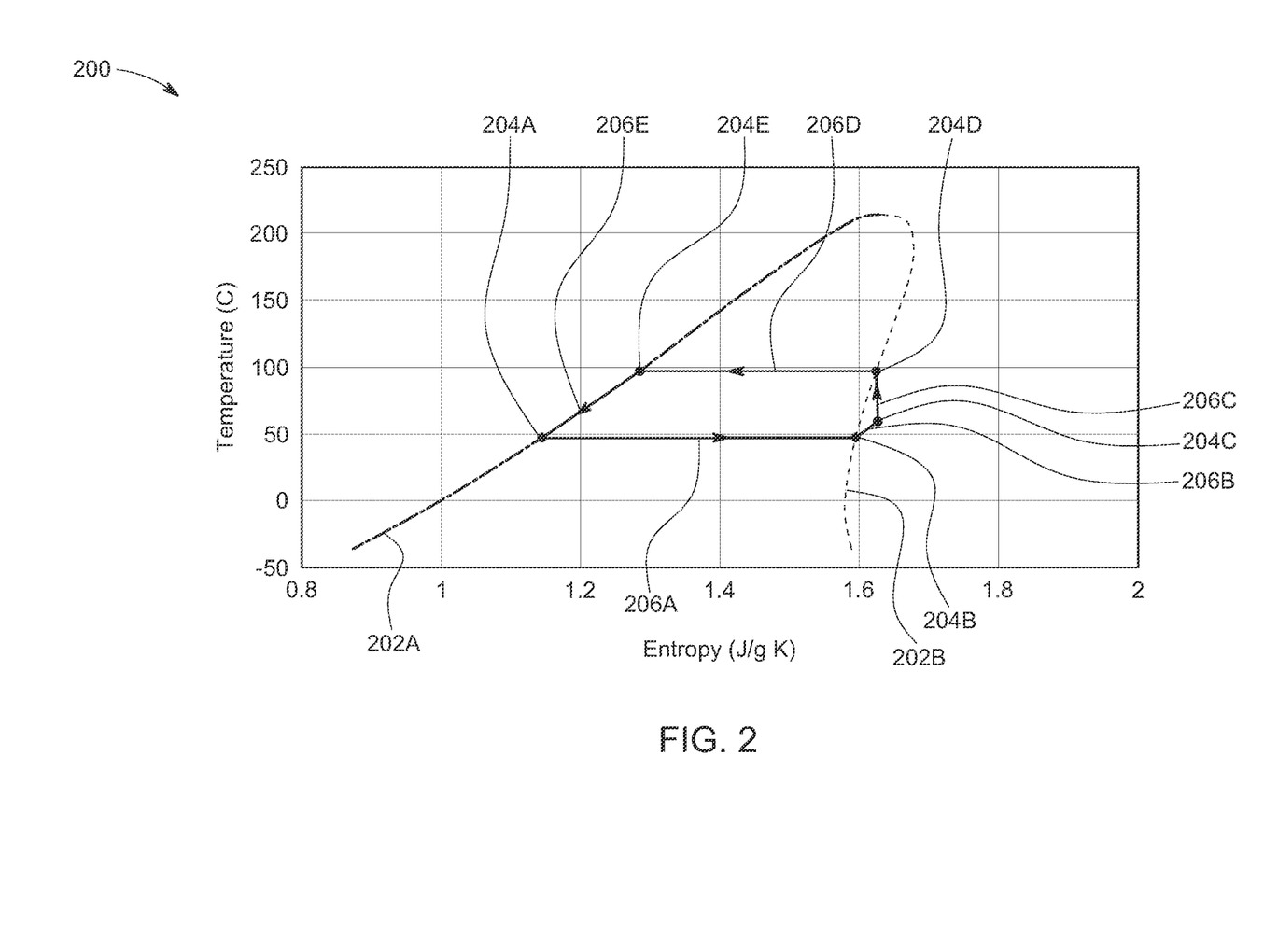
FIG. 2 is a temperature-entropy diagram of a fluid circulating in the system of FIG. 1, according to certain aspects of the present disclosure.

In one example, the system 100 is used with a fluid having a saturation temperature of about 48° C., wherein the pressure of the fluid at the boiling plate 110 is about 1 bar. After flowing through the compressor 130, the fluid is at a temperature of about 96° C. and about 4 bars of pressure, and thus remains saturated. The heat removal capacity of the condenser 140 is improved about 4.7 times when the vapor is saturated a 96° C., as compared to a typical system where the condenser 140 operates on a saturated vapor at a temperature of about 35° C. The typical system can be modified in different ways to take advantage of the increased efficiency of the condenser 140. For example, the condenser 140 can be smaller than the condenser used with a typical system. In another example, less air flow and/or smaller fans can be used with the typical system. FIG. 2 shows a T-S diagram 200 of the fluid as it flows through the system 100, where the horizontal axis measures the entropy of the fluid, and the vertical axis shows the temperature of the fluid. The diagram 200 includes a saturated liquid boundary 202A that shows the saturation temperature when the fluid is in the liquid phase, at various pressures. When the fluid is a liquid with a lower temperature than the saturated liquid boundary 202A, it is considered to be supercooled (non-saturated) liquid. The diagram 200 also includes a saturated vapor boundary 202B that shows the saturation temperature when the fluid is in the vapor phase, at various pressures. When the fluid is a vapor with a higher temperature than the saturated vapor boundary 202B, it is considered to be superheated (non-saturated) vapor. The diagram 200 further includes five points 204A-204E showing the properties of the fluid at different times, and four transitions 206A-206E showing the fluid transitioning between the different points.

Initially, the fluid is at point 204A on the diagram 200, on the saturated liquid boundary 202A. During transition 206A, the fluid transitions from point 204A to point 204B at the boiling plate 110. The boiling plate 110 causes the entropy of the fluid to increase, but the temperature of the fluid remains generally constant. Thus, point 204B is on the saturated vapor boundary 202B, and the fluid remains saturated. However, the fluid is now saturated vapor instead of saturated liquid. During transition 206B, the fluid transitions from point 204B to point 204C at the heating component 120. As shown, the heating component increases the temperature of the fluid to a temperature that is higher than the saturated vapor boundary 202B. Thus, the fluid at point 204C is superheated (e.g., not-saturated) vapor. The entropy of the fluid also increases during transition 206B.

During transition 206C, the fluid transitions from point 204C to point 204D at the compressor 130. The compressor 130 causes the temperature of the fluid to increase, while the entropy generally remains constant. As shown, the temperature of the fluid increases such that point 204D is back on the saturated vapor boundary 202B. Thus, the fluid at point 204B is saturated (e.g., non-superheated) vapor. During transition 206D, the fluid transitions from point 204D to point 204E at the condenser 140. As shown, the condenser 140 decreases the entropy of the fluid, while the temperature of the fluid generally remains constant. Because of this, point 204E is on the saturated liquid boundary 202A, and the fluid transitions from saturated vapor to saturated liquid. During transition 206E, the fluid transitions from point 204E back to point 204A, at the radiator 150. The radiator 150 causes the temperature and the entropy of the fluid to decrease as the pressure decreases. Thus, point 204A remains on the saturated liquid boundary 202A, and the fluid remains a saturated liquid as it transitions from point 204E to point 204A.

The implementation of the system 100 that is illustrated in FIG. 1 and FIG. 2 does not include a pump. When the compressor 130 increases the pressure of the vapor, a higher pressure is created at the output of the compressor 130 as compared to the input. The pressure difference between the input and the output of the compressor 130 is generally large enough to cause the fluid to circulate through the system 100. Thus, the pressure difference between the input and the output of the compressor 130 is generally larger than any sources of pressure loss within the system 100, such as friction between various components of the system 100 and the fluid.

While FIGS. 1 and 2 show a specific implementation of the system 100 for cooling the heat-generating electronic component 10, other implementations can also be used. For example, in some implementations, the system further includes a recirculation pump that is fluidly connected to one or more of the components of the system 100. The pump is configured to pump the fluid through the components and the fluid pathways, in order to aid in causing the fluid to flow through the system 100. In some cases, the pump is used to aid the compressor 130 in causing the fluid to circulate through the system 100. In other cases, the pump is used as an alternative to the compressor 130 in causing the fluid to circulate through the system 100. The pump can be fluidly connected between two of the components of the system 100. For example, the pump can be fluidly connected between the radiator 150 and the boiling plate 110, between the boiling plate 110 and the heating component 120, etc.

In some implementations, the condenser 140 and the radiator 150 are not separate components that are fluidly connected via the fluid pathway segment 102D. Instead, the condenser 140 and the radiator 150 are combined into a single device that performs the functions of both the condenser 140 and the radiator 150. Thus, this single device is configured to remove heat from the fluid to cause the fluid to transition from a saturated vapor to a saturated liquid. The device is also configured to decrease the temperature and the pressure of the saturated liquid, so that the liquid remains saturated, but at a lower temperature.

In some implementations, the system 100 does not include the radiator 150, and instead includes a different component to decrease the pressure of the saturated liquid after the saturated liquid exits the condenser 140. This pressure-decreasing component could be configured to decrease both the pressure and the temperature of the saturated liquid (similar to the radiator 150), or only decrease the pressure. For example, the pressure-decreasing component could include a similar structure as the radiator 150, but not be placed in the path of airflow from the fans 160 and/or not be formed from a thermally conductive material, such that the heat is not removed from the liquid as it travels through the pressure-decreasing component. In some of these implementations, the condenser 140 is be configured to decrease the temperature of the liquid beyond the saturation temperature as fluid condenses from vapor to liquid, such that the liquid exiting the condenser 140 is supercooled. In others of these implementations, the condenser 140 is configured to cause the vapor to condense into the liquid, and the system 100 includes an additional component to decrease the temperature of the liquid. Generally, the pressure-decreasing component can be any suitable component with the ability to decrease the pressure of the saturated liquid.

In some implementations, the system 100 does not include the heating component 120. Certain types of fluids may at least partially condense back to a liquid when these fluids are compressed by the compressor 130 when in a saturated vapor phase. This partial condensation can cause small droplets of liquid to build up in the compressor 130, which can damage the compressor 130. When these types of fluids are used with the system 100, the heating component 120 is used to increase the temperature of the saturated vapor, such that the temperature of the vapor is greater than the saturation temperature when the vapor passes through the compressor 130. Other types of fluids do not partially condense when compressed by the compressor 130. If these types of fluids are used with the system 100, the heating component 120 can be excluded, such that the saturated vapor flows directly from the boiling plate 110 to the compressor 130.

Figure 3:
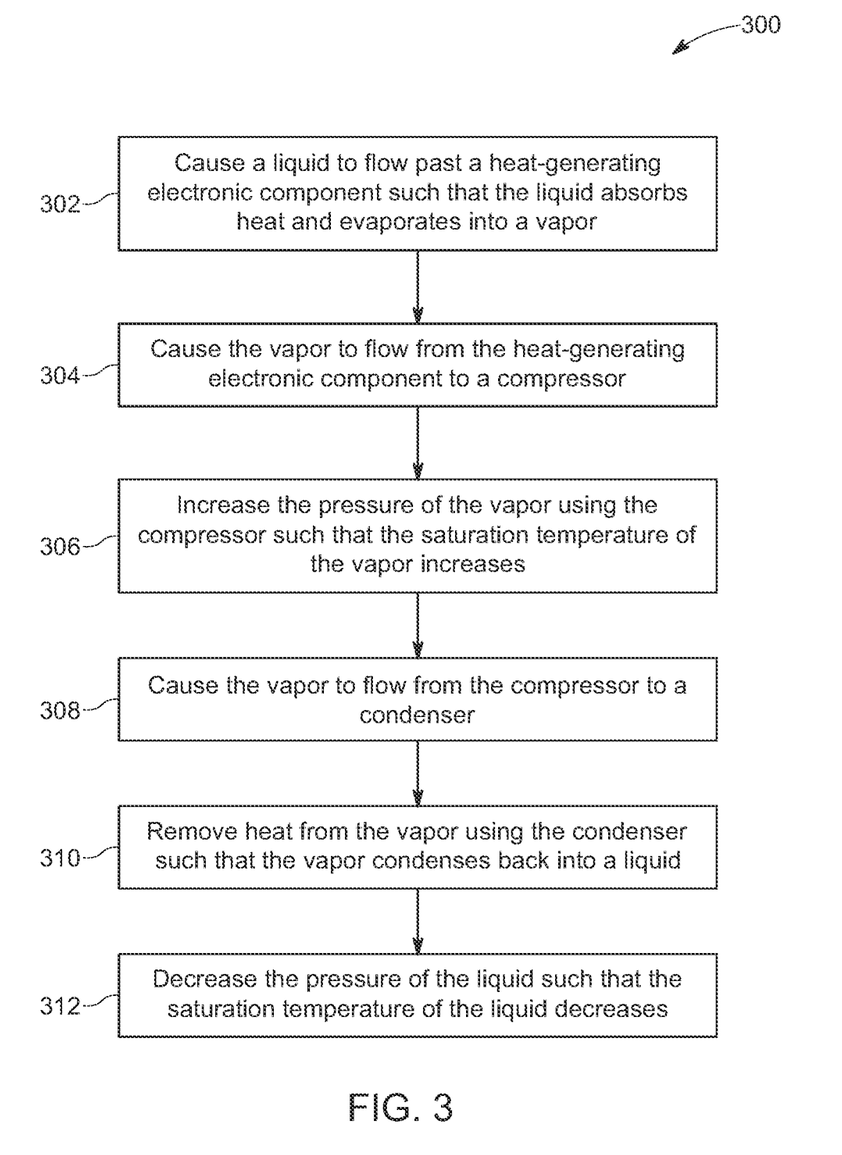
FIG. 3 is a flowchart of a method for cooling a heat-generating electronic component, according to certain aspects of the present disclosure.

FIG. 3 illustrates a flowchart of a method 300 of cooling a heat-generating electronic component. In some implementations, the method 300 uses the system 100 illustrated in FIG. 1. In other implementations, different types of systems can be used.

At step 302 of the method 300, a liquid is caused to flow past the heat-generating electronic component. The heat-generating electronic component can be the same as or similar to the heat-generating electronic component 10 in FIG. 1. As the liquid flows past the heat-generating electronic component, the liquid absorbs heat from the heat-generating electronic component, and evaporates into a vapor. Generally, the liquid will be a saturated liquid as it flows past the heat-generating electronic component, and will be a saturated vapor after it absorbs heat from the heat-generating electronic component. In some cases, a boiling plate (such as boiling plate 110 of system 100) contacts the heat-generating electronic component, and the liquid flows through and/or adjacent to the boiling plate. The boiling plate can absorb heat from the heat-generating electronic component, and the liquid can absorb heat from the boiling plate in addition to or alternatively absorbing heat directly from the liquid.

At step 304 of the method 300, the vapor is caused to flow from the heat-generating electronic component to a compressor. The compressors can be the same as or similar to the compressor 130 in FIG. 1. At step 306, of the method 300, the pressure of the vapor is increased using the compressor. This increase in pressure of the vapor causes the temperature of the vapor to increase, and also causes the saturation temperature of the vapor (e.g., the boiling point of the vapor) to increase from a lower first saturation temperature to a higher second saturation temperature. The vapor thus remains saturated, but at a higher temperature than the saturated vapor formed at the heat-generating electronic component.

At step 308 of the method 300, the vapor is caused to flow from the compressor to a condenser. The condenser can be the same as or similar to the condenser 140 in FIG. 1. At step 310 of the method 300, heat is removed from the vapor using the condenser, such that the vapor condenses back into a liquid. Generally, the condenser removes only enough heat to condense the vapor back into the liquid, and thus the liquid is a saturated liquid. Thus, heat absorbed by the liquid from the heat-generating electronic component is eventually removed by the condenser. In some cases, the method includes causing air to flow past the condenser using one or more fans (which may be the same as or similar to the fans 160 in FIG. 1). The air flowing past the condenser aids in removing heat from the vapor and causing the vapor to condense back into the liquid.

Step 312 of the method 300 includes decreasing the pressure of the liquid to cause the saturation temperature of the liquid to decrease from the second saturation temperature back to the first saturation temperature. In some implementations, step 312 includes causing the liquid to flow through a radiator, such as the radiator 150 in FIG. 1. The radiator can also be used to further decrease the actual current temperature of the liquid, such that the liquid remains saturated. In some cases, the method includes causing air to flow past the radiator using the one or more fans, similar to how the fans can be used to flow air past the condenser. The air flowing past the radiator aids in removing heat from the liquid so that the liquid remains saturated. In other implementations, step 312 includes causing the liquid to flow through a pressure-decreasing component other than a radiator. This pressure-decreasing component may decrease only the pressure of the liquid, or both the pressure and the temperature.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A fluid cooling system comprising: a boiling plate configured to contact a heat-generating electronic component, the boiling plate being configured to receive a first saturated liquid having a first saturation temperature such that the first saturated liquid absorbs heat from the heat-generating electronic component and evaporates into a first saturated vapor having the first saturation temperature and an identical temperature as the first saturated liquid; a compressor fluidly connected to the heat-generating electronic component, the compressor being configured to receive the vapor from the heat-generating electronic component and increase a pressure of the received vapor such that (i) the saturation temperature of the vapor increases from the first saturation temperature to a second saturation temperature and (ii) the first saturation temperature of the vapor increases to the second saturation temperature and the vapor becomes a second saturated vapor with a higher temperature than the first saturated vapor; a condenser fluidly connected to the compressor, the condenser being configured to receive the second saturated vapor from the compressor and remove heat from the second saturated vapor such that the second saturated vapor condenses into a second saturated liquid having the second saturation temperature and an identical temperature as the second saturated vapor; and a radiator fluidly coupled between the condenser and the boiling plate, the radiator being configured to receive the second saturated liquid and to decrease a temperature and a pressure of the second saturated liquid such that a saturation temperature of the second saturated liquid decreases from the second saturation temperature to the first saturation temperature and the second saturated liquid turns into the first saturated liquid.

2. The system of claim 1, wherein a liquid received by the boiling plate is saturated liquid, and wherein absorption of the heat from the heat-generating electronic component causes the saturated liquid to become saturated vapor.

3. The system of claim 2, wherein removing heat from the saturated vapor by the condenser causes the saturated vapor to become saturated liquid.

4. The system of claim 1, wherein the boiling plate is configured to receive the liquid from the radiator.

5. The system of claim 1, further comprising one or more fans, the one or more fans being configured to cause air to flow past the condenser, the radiator, or both the condenser and the radiator.

6. The system of claim 5, wherein the air flowing past the condenser aids in removing heat from the vapor to cause the vapor to condense back into the liquid.

7. The system of claim 5, wherein the air flowing past the radiator aids in removing heat from the liquid to decrease the temperature of the liquid.

8. The system of claim 1, wherein the increase in pressure of the vapor by the compressor causes the liquid and the vapor to circulate between the boiling plate, the compressor, and the condenser.

9. The system of claim 1, wherein the boiling plate is formed at least partially from a thermally conductive material that is configured to conduct heat from the heat-generating electronic component to the liquid.

10. The system of claim 1, wherein the boiling plate has a liquid input configured to receive the liquid from the condenser, and a vapor output configured to output the vapor to the compressor.

11. The system of claim 10, wherein the liquid absorbs heat from the heat-generating electronic component and evaporates into the vapor as the liquid travels from the liquid input to the vapor output.

12. The system of claim 1, further comprising a heating component fluidly coupled between the boiling plate and the compressor, the heating component configured to increase the temperature of the vapor and not the saturation temperature of the vapor.

13. A method of cooling a heat-generating electronic component, the method comprising: causing a first saturated liquid having a first saturation temperature to flow past the heat-generating electronic component, such that the liquid absorbs heat from the heat-generating electronic component and evaporates into a first saturated vapor having the first saturation temperature and an identical temperature as the first saturated liquid; causing the vapor to flow from the heat-generating electronic component to a compressor; increasing a pressure of the vapor using the compressor such that (i) the saturation temperature of the vapor increases and (ii) the temperature of the superheated vapor increases to the second saturation temperature and the vapor becomes a second saturated vapor with a higher temperature than the first saturated vapor; causing the second saturated vapor to flow from the compressor to a condenser; removing heat from the second saturated vapor using the condenser such that the second saturated vapor condenses into a second saturated liquid having the second saturation temperature and an identical temperature as the second saturated vapor; causing the second saturated liquid to flow from the condenser to a radiator; and decreasing a temperature and a pressure of the second saturated liquid using the radiator such that a saturation temperature of the second saturated liquid decreases from the second saturation temperature to the first saturation temperature and the second saturated liquid turns into the first saturated liquid.

14. The method of claim 13, further comprising causing air to flow past the condenser, the radiator, or both the condenser and the radiator, using one or more fans.

15. The method of claim 14, wherein the air flowing past the condenser removes heat from the vapor and causes the vapor to condense back into the liquid, and wherein the air flowing past the radiator removes heat from the liquid to decrease the temperature of the liquid.

16. The method of claim 13, wherein the liquid that flows past the heat-generating electronic component is saturated liquid, and wherein absorption of the heat from the heat-generating electronic component causes the saturated liquid to become saturated vapor.

17. The method of claim 16, wherein removing heat from the saturated vapor by the condenser causes the saturated vapor to become saturated liquid.

* * * * *